United States Patent
Riegel et al.

(10) Patent No.: US 10,263,214 B2
(45) Date of Patent: Apr. 16, 2019

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Nina Riegel, Tegernheim (DE); Sebastian Wittmann, Regensburg (DE); Erwin Lang, Regensburg (DE); Arne Fleissner, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 5 days.

(21) Appl. No.: 15/823,643

(22) Filed: Nov. 28, 2017

(65) Prior Publication Data

US 2018/0151833 A1     May 31, 2018

(30) Foreign Application Priority Data

Nov. 28, 2016 (DE) .................. 10 2016 122 901

(51) Int. Cl.
*H01L 51/52* (2006.01)
*H01L 51/56* (2006.01)
*H01L 51/00* (2006.01)

(52) U.S. Cl.
CPC ...... *H01L 51/5237* (2013.01); *H01L 51/5253* (2013.01); *H01L 51/5268* (2013.01); *H01L 51/56* (2013.01); *H01L 51/0097* (2013.01)

(58) Field of Classification Search
CPC .. H01L 51/5237; H01L 51/5268; H01L 51/56
See application file for complete search history.

(56) References Cited

U.S. PATENT DOCUMENTS 4,321,417 A * 3/1982 Kurth ............... H01L 31/048
                                              136/246
7,345,419 B2 * 3/2008 Gotoh ............... H01L 51/0096
                                              313/498

(Continued)

FOREIGN PATENT DOCUMENTS

DE    10 2013 111 785 A1    4/2015
EP          2287938 A1    2/2011

OTHER PUBLICATIONS

Won Hoe Koo et al., "Light extraction from organic light-emitting diodes enhanced by spontaneously formed buckles", Nature Photonics, Apr. 2010, pp. 222-226, vol. 4.

(Continued)

*Primary Examiner* — William Coleman
(74) *Attorney, Agent, or Firm* — Viering, Jentschura & Partner MBB

(57) ABSTRACT

In various embodiments, an optoelectronic component is provided. The optoelectronic component includes an optically active layer structure on a surface of a planar substrate. The surface in a predefined region is free of optically active layer structure. The optoelectronic component further includes an encapsulation structure having an inorganic encapsulation layer. The inorganic encapsulation layer is formed on or above the optically active layer structure and the surface of the substrate in the predefined region. The inorganic encapsulation layer at least in the predefined region is formed in direct contact with the surface of the substrate. The surface of the substrate at least in the predefined region includes a structuring. The structuring is configured to increase the roughness of the surface. The substrate at least in the predefined region at the surface thereof includes or is formed from an inorganic material.

15 Claims, 5 Drawing Sheets

(56) References Cited

U.S. PATENT DOCUMENTS

| | | | | |
|---|---|---|---|---|
| 7,486,368 | B2* | 2/2009 | Sakakura | H01L 51/5237 |
| | | | | 349/153 |
| 8,389,303 | B2* | 3/2013 | Takezoe | H01L 51/0014 |
| | | | | 257/40 |
| 8,791,469 | B2* | 7/2014 | Shinohara | H01L 33/005 |
| | | | | 257/79 |
| 9,159,950 | B2* | 10/2015 | Kim | H01L 51/56 |
| 9,196,804 | B2* | 11/2015 | Cho | H01L 33/56 |
| 9,246,122 | B2* | 1/2016 | Shinotsuka | H01L 51/5225 |
| 9,333,531 | B2* | 5/2016 | Fan | H01L 51/0096 |
| 9,891,475 | B2* | 2/2018 | Lee | G02F 1/1339 |
| 2004/0012980 | A1 | 1/2004 | Sugiura et al. | |
| 2011/0045392 | A1 | 2/2011 | Lemmer et al. | |
| 2013/0168647 | A1 | 7/2013 | Diekmann et al. | |
| 2015/0034925 | A1 | 2/2015 | Shinotsuka et al. | |
| 2016/0248038 | A1 | 8/2016 | Philippens et al. | |

OTHER PUBLICATIONS

Domagoj Pavicic et al., "Efficient White PIN OLED Structures with Internal and External Light Outcoupling Enhancement", IDW, 2011, pp. 459-462.

\* cited by examiner

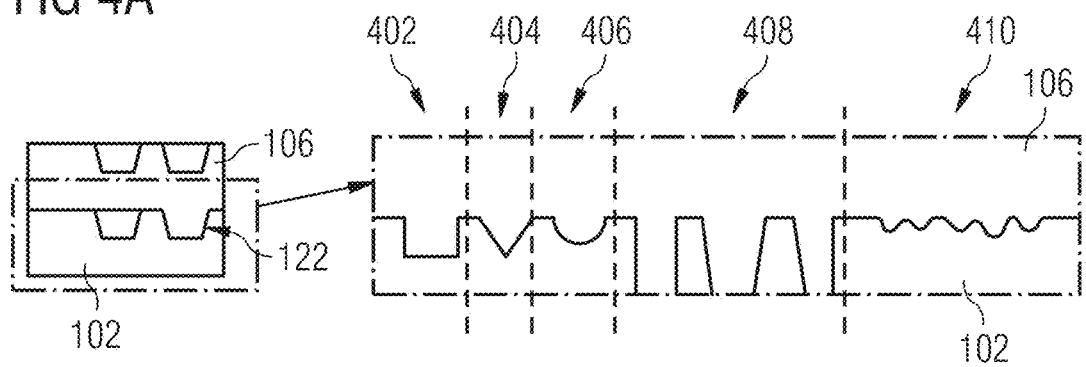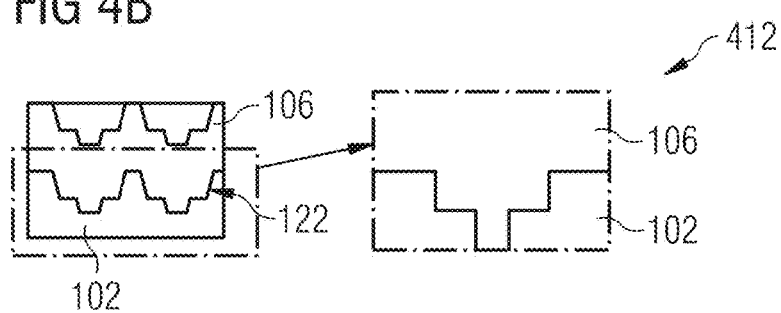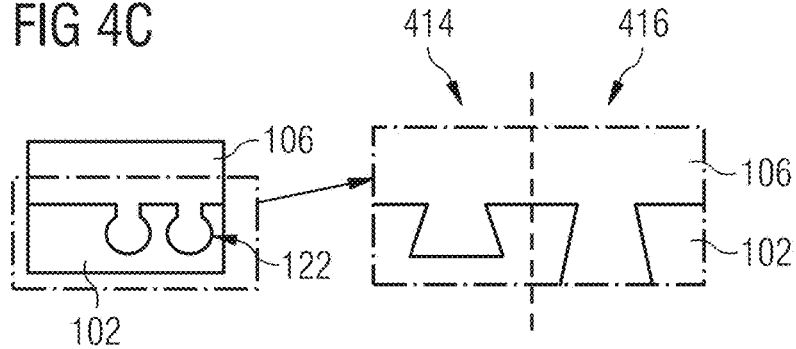

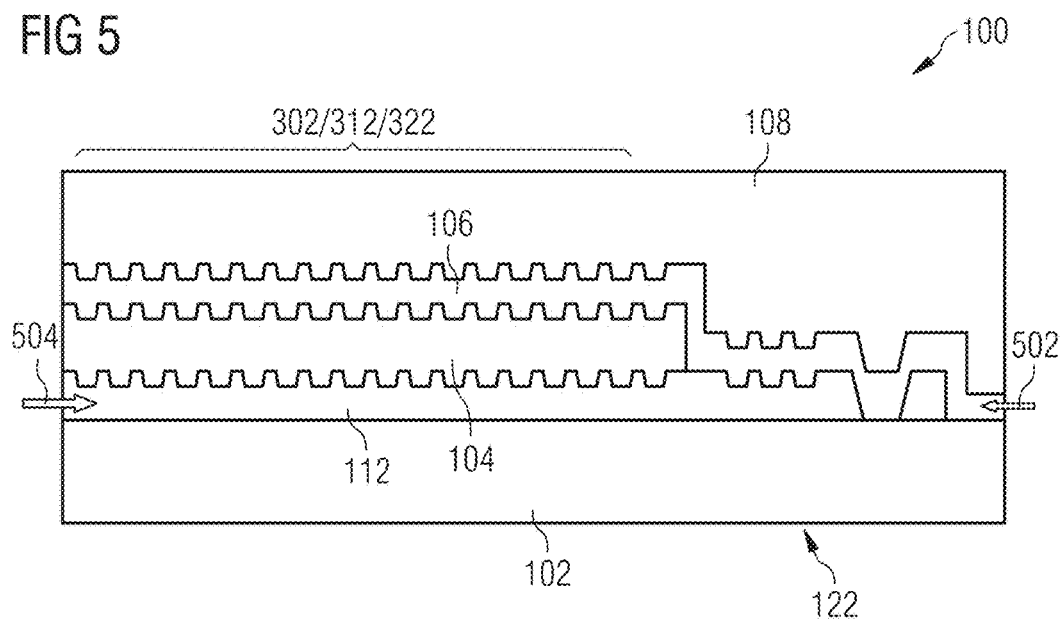
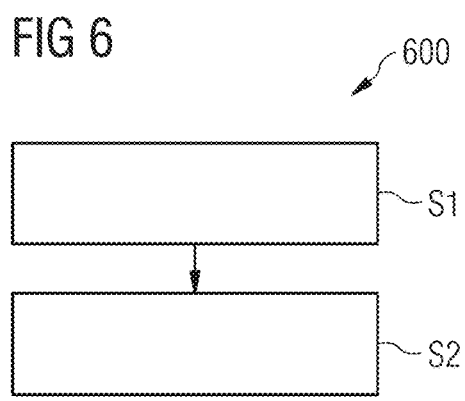

FIG 7
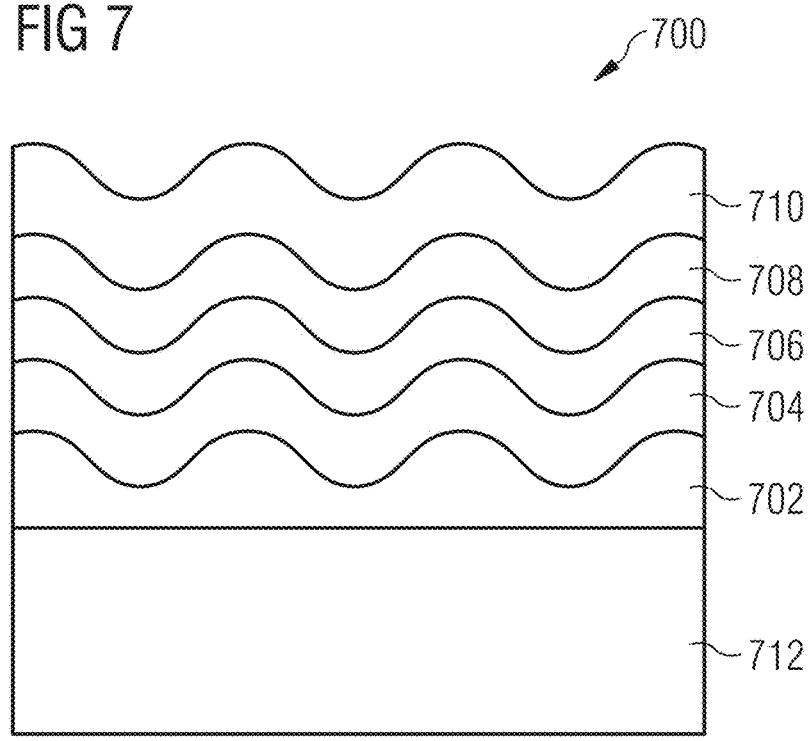
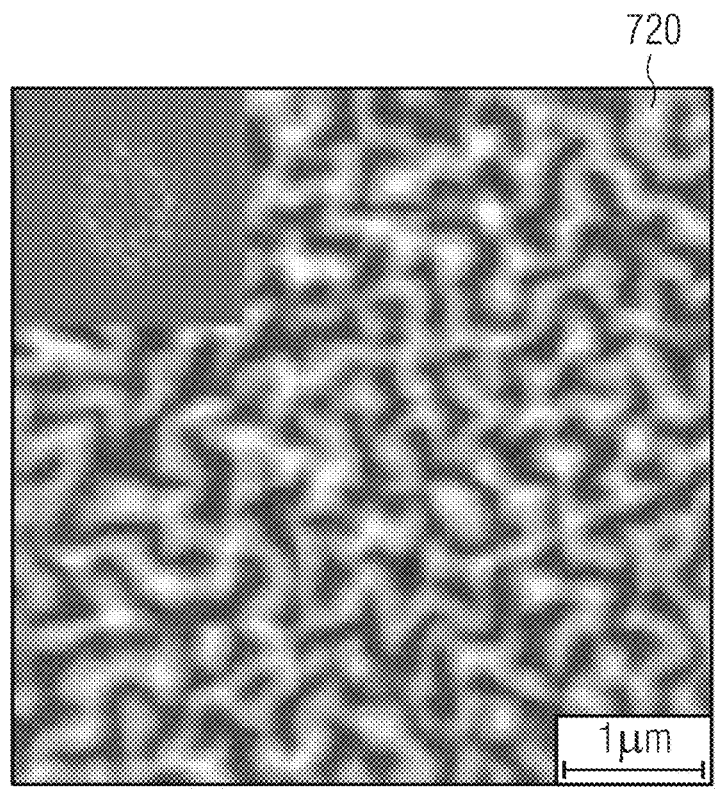

OPTOELECTRONIC COMPONENT AND METHOD FOR PRODUCING AN OPTOELECTRONIC COMPONENT

CROSS-REFERENCE TO RELATED APPLICATION

This application claims priority to German Patent Application Serial No. 10 2016 122 901.6, which was filed Nov. 28, 2016, and is incorporated herein by reference in its entirety.

TECHNICAL FIELD

Various embodiments relate generally to an optoelectronic component and a method for producing an optoelectronic component.

BACKGROUND

Optoelectronic components on an organic basis, for example organic light-emitting diodes (OLEDs), are being increasingly widely used as a surface light source.

An organic light-emitting diode (OLED) may include on a carrier an anode and a cathode with an organic functional layer system therebetween. In a conventional OLED there are height differences in the range of up to 1 μm on account of the structuring of the anode, the stacking of the layers and resist structures.

The organic constituents of said components are often susceptible vis-à-vis harmful environmental influences, for example water and/or oxygen. For protection against harmful environmental influences OLEDs are surrounded with an encapsulation, for example a thin film encapsulation (TFE). In OLEDs, for example upon the bending of flexible OLEDs, delamination can occur between individual layers within the OLED, e.g. within the TFE, coatings on the TFE, etc., which can lead to a total failure of the OLED. Possible damage mechanisms are for example a delamination of the TFE or the delamination of protective layers, for example of a lacquer, from the OLED carrier.

In the light-emitting area, adhesion is normally provided by the weak adhesion force of the encapsulation layers among one another or towards the two electrode interfaces (e.g. ITO, Al). The adhesion force of the layers is significantly higher in the edge region, since e.g. the encapsulation layers of the TFE are applied directly on the encapsulation layers of the carrier. The adhesion force of the overall component is predominantly determined thereby.

In the automotive sector, (flexible) OLEDs necessitate stringent requirements with regard to reliability and fail-safety, for example thermal cycling tests, harmful gas tests, storage with exposure to moisture under elevated temperature loading, etc. Under extreme test conditions, however, the adhesion force is still insufficient to withstand all the test conditions without faults. Moreover, as a result of the process implementation e.g. during laser processing (laser separation, laser ablation), faults such as delamination of the TFE layers among one another can be induced, which can lead to failure in subsequent tests of robustness.

Furthermore, without measures for coupling out light from the OLED, on account of total internal reflection within the OLED layers, only around 20% of the light generated in the light-generating organic encapsulation layer of the OLED passes to the outside. EP2287938A1 (Lemmer et al.) describes a scattering charge carrier transport layer as a result of the introduction of scattering centres within the active OLED layers. Alternatively, the coupling-out of light is increased by scattering layers having a high refractive index directly adjacent to the transparent electrode.

For OLEDs that emit light through the carrier, an organic semiconductor material is known which crystallizes upon thermal vapour deposition onto underlying organic semiconductor layers. As a result of the morphology that arises in this case, the interface between organic system and metallic electrode vapour-deposited thereon is not smooth, but rather wavy, which prevents the waveguiding in the OLED layers, as known from Pavicic et al., Proceedings Of International Display Week (2011) 459.

Furthermore, a non-planar OLED substrate is known from Koo et al. Nature Photonics 4, 222-226 (2010) (see FIG. 7). FIG. 7 shows a schematic sectional illustration and a micrograph of a conventional organic light-emitting diode (OLED). The schematic cross-sectional view 700 shows a layer stack of an organic light-emitting diode in which the surface of a glass carrier 712 is structured by means of a UV-curable resin 702. An OLED (704-710) is subsequently fabricated on the non-planar substrate surface, i.e. the structuring 702. That is to say that a 120 nm thick ITO layer 704 is formed as an anode on the surface of the structuring 702. A 40 nm thick TPD layer 706 is formed on the ITO layer 704, on which TPD layer a 30 nm thick Alq3 layer 708 is formed as an emitter layer. A 150 nm thick Al layer 710 is formed as a cathode on the Alq3 layer 708. A micrograph 720 of the surface of such a layer stack is shown besides the schematic cross-sectional view 700. It is possible to discern the non-planar surface of such an organic light-emitting diode and, from the image insert, the regularity of the undulation. In the case of the structuring of a surface of a carrier with an organic material there is the risk of a lateral penetration path for oxygen and water through the organic encapsulation layer.

SUMMARY

In various embodiments, an optoelectronic component is provided. The optoelectronic component includes an optically active layer structure on a surface of a planar substrate. The surface in a predefined region is free of optically active layer structure. The optoelectronic component further includes an encapsulation structure having an inorganic encapsulation layer. The inorganic encapsulation layer is formed on or above the optically active layer structure and the surface of the substrate in the predefined region. The inorganic encapsulation layer at least in the predefined region is formed in direct contact with the surface of the substrate. The surface of the substrate at least in the predefined region includes a structuring. The structuring is configured to increase the roughness of the surface. The substrate at least in the predefined region at the surface thereof includes or is formed from an inorganic material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 4A to 4C show schematic sectional illustrations of various embodiments of a structuring of an optoelectronic component;

FIG. 5 shows a schematic sectional illustration of an optoelectronic component in accordance with various embodiments;

FIG. 6 shows a flow diagram of one embodiment of a method for producing an optoelectronic component; and FIG. 7 shows a schematic sectional illustration and an AFM micrograph of a conventional organic light-emitting diode.

DESCRIPTION

In the following detailed description, reference is made to the accompanying drawings, which form part of this description and show for illustration purposes specific embodiments in which the invention can be implemented. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims. In the figures, identical or similar elements are provided with identical reference signs, in so far as this is expedient.

An optoelectronic assembly may include one, two or more optoelectronic components. Optionally, an optoelectronic assembly may also include one, two or more electronic components. An electronic component may include for example an active and/or a passive component. An active electronic component may include for example a computing, control and/or regulating unit and/or a transistor. A passive electronic component may include for example a capacitor, a resistor, a diode or a coil.

An optoelectronic component can be an electromagnetic radiation emitting component or an electromagnetic radiation absorbing component. An electromagnetic radiation absorbing component can be a solar cell, for example. In various embodiments, an electromagnetic radiation emitting component can be an electromagnetic radiation emitting semiconductor component and/or be formed as an electromagnetic radiation emitting diode, as an organic electromagnetic radiation emitting diode, as an electromagnetic radiation emitting transistor or as an organic electromagnetic radiation emitting transistor. The radiation can be for example light in the visible range, UV light and/or infrared light. In this context, the electromagnetic radiation emitting component can be formed for example as a light-emitting diode (LED), as an organic light-emitting diode (OLED), as a light-emitting transistor or as an organic light-emitting transistor. In various embodiments, the light-emitting component can be part of an integrated circuit. Furthermore, a plurality of light-emitting components can be provided, for example in a manner accommodated in a common housing.

Figure 1:
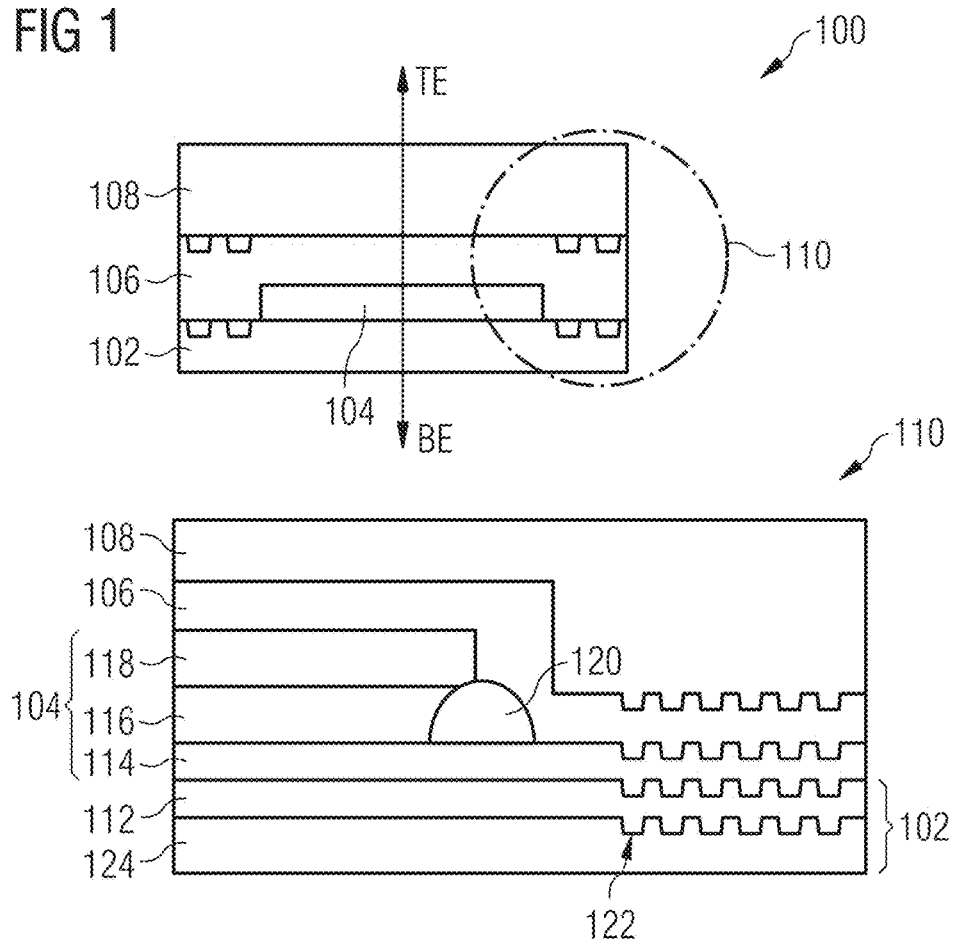
FIG. 1 shows schematic sectional illustrations of an optoelectronic component in accordance with various embodiments.

FIG. 1 shows schematic sectional illustrations of an optoelectronic component 100 in accordance with various embodiments.

The illustration shows an optically active layer structure 104 on a substrate 102, on which an encapsulation structure is formed. The encapsulation structure includes an inorganic encapsulation layer 106, which is formed in physical contact on the substrate 102 and the optically active layer structure.

The encapsulation structure may furthermore include an organic encapsulation layer 108 on the inorganic encapsulation layer 106, as will be described in even greater detail below.

In the optically inactive region, for example on the same surface of the substrate 102 as the optically active layer structure 104, the substrate includes a structuring 122. The optically inactive region is illustrated in an enlarged manner in FIG. 1 (illustrated by the reference sign 110).

In other words: the optoelectronic component 100 includes an optically active layer structure 104 on a surface of a planar substrate 102. The surface in a predefined region is free of optically active layer structure 104. The predefined region is arranged for example alongside the optically active layer structure on the same substrate. By way of example, the predefined region surrounds the optically active layer structure.

The inorganic encapsulation layer 106 is formed in direct contact on the optically active layer structure 104 and in the predefined region on the surface of the substrate 102. The surface of the substrate 102 at least in the predefined region includes a structuring 122. The structuring 122 is configured to increase the roughness of the surface of the substrate 102.

In other words: the structuring is incorporated into the substrate 102. By way of example, a minimum height difference of the structuring of 1 µm or more can be achieved as a result. The greater the height difference, the greater the adhesion-enhancing effect.

Individual very thin layers can also tear away in the case of large height differences of the structures of the structuring or in the case of undercut structures at the edge region of the optoelectronic component as structuring. As a result, it is possible to form interruptions in a layer, for example the inorganic encapsulation layer, in a controlled manner without the need for a further process step, for example laser cutting or laser ablation.

In addition, the optically active layer structure 104 and the substrate 102 are illustrated in greater detail in the enlarged portion 110.

The structuring 122 brings about an increase in the roughness of the surface of the substrate 102 or the contact area of the inorganic encapsulation layer 106 with the substrate. As a result, the adhesion of the inorganic encapsulation layer can be increased, thereby reducing the risk of a delamination of the encapsulation structure from the substrate 102.

The structure, i.e. the topology of the surface of the substrate, can continue in the surface of the inorganic encapsulation layer and the layers formed thereon. Alternatively, one of the layers, which is formed on or above the structuring 122 of the surface of the substrate 102, can also be configured for planarizing the topology.

In various embodiments, the substrate 102 may include a carrier 124 and a barrier layer 112. The barrier layer 112 can form or be arranged at the surface of the substrate 102.

The barrier layer 112 can be an inorganic, electrically non-conductive layer 112, which forms at least one part of the surface of the substrate. The barrier layer 112 is formed from or includes an inorganic material. In other words: the substrate 102 at the surface thereof includes or is formed from an inorganic material. The physical contact of the inorganic encapsulation layer with the surface of the substrate is an inorganic-inorganic interface.

The substrate 102 may include a metallic structure. The metallic structure can be a metal sheet, a metal film or a metal-coated film. The metallic structure is for example the metallic carrier 124 of the substrate 102 and the inorganic, electrically non-conductive layer 112 can be formed on the metallic structure.

In various embodiments, the structuring 122 may include or be formed from an organic material.

The optically active layer structure 104 may include a first electrode 114 directly on the surface of the substrate 102, for example on the barrier layer 112. An organic functional layer structure 116 is formed on the first electrode 114. A second electrode 118 is formed on the organic functional layer structure 116. The first electrode 114 is electrically insulated from the second electrode 118 by an insulation structure 120. The optically active layer structure 102 is protected against indiffusion of water and/or oxygen by the encapsulation structure. The encapsulation structure may include a plurality of layers and/or structures.

The optoelectronic component 100 can be formed as a top emitter in which light can be emitted through the encapsulation structure (illustrated by means of the arrow TE in FIG. 1). Alternatively or additionally, the optoelectronic component 100 can be formed as a bottom emitter in which light can be emitted through the substrate 102 (illustrated by the arrow BE in FIG. 1).

Figure 2:
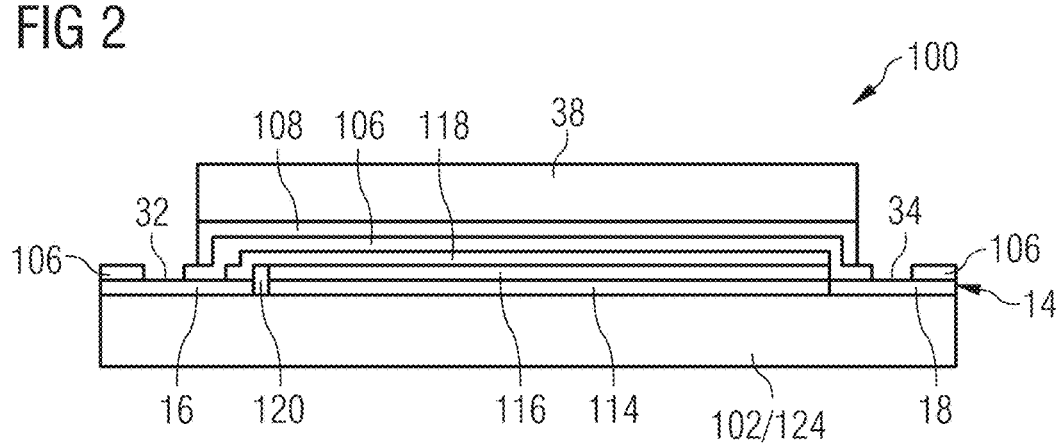
FIG. 2 shows a schematic sectional illustration of an optoelectronic component in accordance with various embodiments.

FIG. 2 shows a schematic sectional illustration of an optoelectronic component 100 in accordance with various embodiments. Component parts of the optoelectronic component described above are described in greater detail in FIG. 2.

The carrier 124 and/or the substrate 102 can be formed as translucent or transparent.

The carrier 124 or respectively the substrate 102 serves as a carrier element for electronic elements or layers, for example light-emitting elements.

The carrier 124 or respectively the substrate may include or be formed from, for example, plastic, metal, glass, quartz and/or a semiconductor material. Furthermore, the carrier 124 or respectively the substrate may include or be formed from a plastics film or a laminate including one or a plurality of plastics films. The carrier 124 can be formed as mechanically rigid or mechanically flexible.

The optically active layer structure 104 includes a first electrode layer 14, which includes a first contact section 16, a second contact section 18 and a first electrode 114. A first barrier layer (not illustrated), for example a first barrier thin-film layer, can be formed between the carrier 124 and the first electrode layer 14. The carrier 124 together with the first barrier thin-film layer can be referred to as substrate 102.

The first electrode 114 is electrically insulated from the first contact section 16 by an electrical insulation barrier 120. The second contact section 18 is electrically coupled to the first electrode 114 of the optically active layer structure. The first electrode 114 can be formed as an anode or as a cathode. The first electrode 114 can be formed as translucent or transparent. The first electrode 114 includes an electrically conductive material, for example metal and/or a transparent conductive oxide (TCO) or a layer stack of a plurality of layers including metals or TCOs. The first electrode 114 may include for example a layer stack of a combination of a layer of a metal on a layer of a TCO, or vice versa. One example is a silver layer applied on an indium tin oxide (ITO) layer (Ag on ITO) or ITO-Ag-ITO multilayers. The first electrode 114 may include as an alternative or in addition to the materials mentioned: networks composed of metallic nanowires and nanoparticles, for example composed of Ag, networks composed of carbon nanotubes, graphene particles and graphene layers and/or networks composed of semiconducting nanowires.

An optically functional layer structure, for example an organic functional layer structure 116, of the optically active layer structure is formed above the first electrode 114. The organic functional layer structure 116 may include for example one, two or more sublayers. By way of example, the organic functional layer structure 116 may include a hole injection layer, a hole transport layer, an emitter layer, an electron transport layer and/or an electron injection layer. The hole injection layer serves for reducing the band gap between first electrode and hole transport layer. In the case of the hole transport layer, the hole conductivity is greater than the electron conductivity. The hole transport layer serves for transporting the holes. In the case of the electron transport layer, the electron conductivity is greater than the hole conductivity. The electron transport layer serves for transporting the electrons. The electron injection layer serves for reducing the band gap between second electrode and electron transport layer. Furthermore, the organic functional layer structure 116 may include one, two or more functional layer structure units each including the above-mentioned sublayers and/or further intermediate layers.

A second electrode 118 of the optically active layer structure is formed above the organic functional layer structure 116, said second electrode being electrically coupled to the first contact section 16. The second electrode 118 can be formed in accordance with one of the configurations of the first electrode 114, wherein the first electrode 114 and the second electrode 118 can be formed identically or differently. The first electrode 114 serves for example as an anode or a cathode of the optically active layer structure. The second electrode 118, in a corresponding manner to the first electrode, serves as a cathode or an anode of the optically active layer structure.

The optically active layer structure 104 is also an electrically active region. The electrically active region is that region of the optoelectronic component 100 in which electric current for the operation of the optoelectronic component 100 flows and/or in which electromagnetic radiation is generated or absorbed.

A getter structure (not illustrated) can be arranged on or above the optically active region. The getter layer can be formed as translucent, transparent or opaque. The getter layer may include or be formed from a material which absorbs and binds substances that are harmful to the active region.

An encapsulation structure of the optically active layer structure 104 is formed above the second electrode 118 and partly above the first contact section 16 and partly above the second contact section 18, said encapsulation structure encapsulating the optically active layer structure 104.

The inorganic encapsulation layer 106 of the encapsulation structure can be formed as a second barrier layer, for example as a second barrier thin-film layer. The encapsulation layer 106 can also be referred to as thin film encapsulation. The encapsulation layer 106 forms a barrier with respect to chemical contaminants and/or atmospheric substances, for example with respect to water (moisture) and oxygen. In other words: the inorganic encapsulation layer 106 can be formed such that it is hermetically impermeable vis-à-vis diffusion of water and/or oxygen. The encapsulation layer 106 can be formed as a single layer, a layer stack or a layer structure. The encapsulation layer 106 may include or be formed from: aluminium oxide, zinc oxide, zirconium oxide, titanium oxide, hafnium oxide, tantalum oxide, lanthanum oxide, silicon oxide, silicon nitride, silicon oxynitride, silicon carbide, indium tin oxide, indium zinc oxide, aluminium-doped zinc oxide, poly(p-phenylene terephthalamide), Nylon 66, and mixtures and alloys of the above mentioned materials. If appropriate, the first barrier layer can be formed on the carrier 124 in a corresponding manner to a configuration of the encapsulation layer 106.

In the encapsulation layer 106, a first cutout of the encapsulation layer 106 is formed above the first contact section 16 and a second cutout of the encapsulation layer 106 is formed above the second contact section 18. A first contact region 32 is exposed in the first cutout of the encapsulation layer 106 and a second contact region 34 is exposed in the second cutout of the encapsulation layer 106. The first contact region 32 serves for electrically contacting the first contact section 16 and the second contact region 34 serves for electrically contacting the second contact section 18.

The edges or sidewalls of the cutout can be formed for example by means of the structuring of the surface of the substrate. By way of example, an undercut structure can be provided in the region of a sidewall or edge of the cutout. In this case, the region of the opening of the undercut structure remains free of encapsulation layer. A hermetically impermeable transition from contact section to encapsulation layer is made possible as a result. The encapsulation layer optionally remaining in the contact section can subsequently be removed, for example by means of a laser ablation.

The encapsulation structure may include above the encapsulation layer 106 an adhesion medium layer 108, which can also be referred to as an organic encapsulation layer. The organic encapsulation layer 108 can have a roughness that is lower than the roughness of the inorganic encapsulation layer 106. In other words: the organic encapsulation layer 108 can bring about a planarization of the topology of the structuring of the surface of the substrate and/or of the inorganic encapsulation layer.

The adhesion medium layer 108 includes for example an adhesion medium, for example an adhesive, for example a lamination adhesive, a lacquer and/or a resin. The adhesion medium layer 108 may include for example particles which scatter electromagnetic radiation, for example light-scattering particles.

The encapsulation structure may include a covering body 38 above the adhesion medium layer 108. The adhesion medium layer 108 serves for fixing the covering body 38 to the inorganic encapsulation layer 106. The covering body 38 includes for example plastic, glass and/or metal. By way of example, the covering body 38 can be formed substantially from glass and include a thin metal layer, for example a metal foil, and/or a graphite layer, for example a graphite laminate, on the glass body. The covering body 38 serves for protecting the conventional optoelectronic component 1, for example against mechanical force influences from outside. Furthermore, the covering body 38 can serve for distributing and/or dissipating heat generated in the conventional optoelectronic component 100. By way of example, the glass of the covering body 38 can serve as protection against external influences and the metal layer of the covering body 38 can serve for distributing and/or dissipating the heat that arises during the operation of the conventional optoelectronic component 100.

Figure 3A:
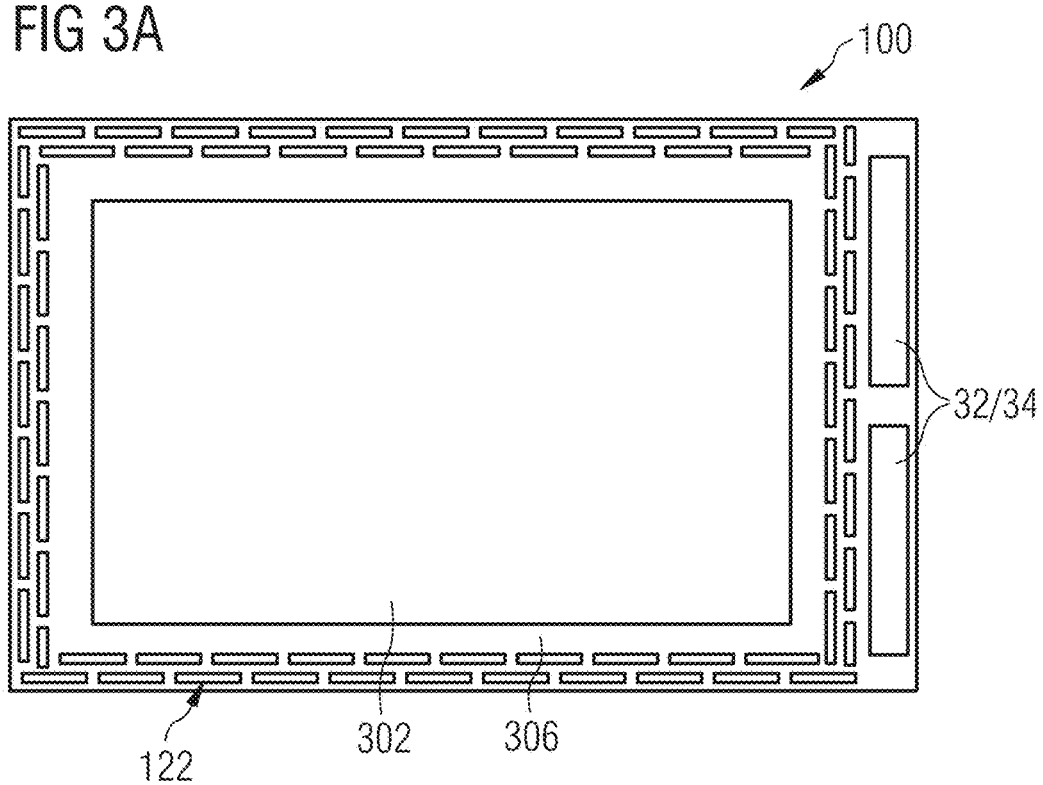
FIGS. 3A and 3B show schematic plan views of an optoelectronic component in accordance with various embodiments.
Figure 3B:
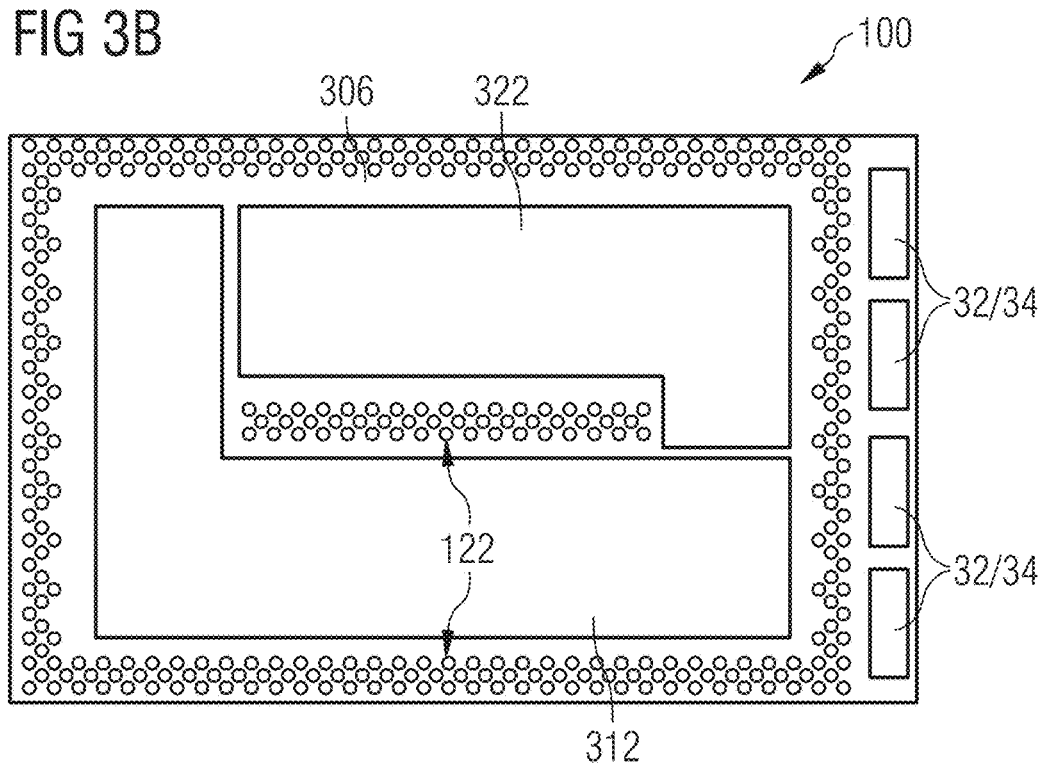

FIG. 3A and FIG. 3B show schematic plan views of an optoelectronic component in accordance with various embodiments. As is illustrated, the structuring 122 can be configured to circumferentially surround the optically active layer structure 104. Such a structuring can be formed for example in the form of a closed dam or trench structure.

As is illustrated in FIG. 3A, the plurality of structurings 122 can be arranged circumferentially with respect to an optically active region 302, that is to say that the structurings 122 are arranged in an optically inactive region 306. In this case, the structurings 122 can be arranged in a manner offset laterally with respect to one another, for example in two series. However, the structurings 122 can also be arranged in one or a plurality of series.

However, the surface can also include a plurality of structurings 122. The plurality of structurings can be offset laterally with respect to one another. The plurality of structurings can be arranged in a plurality of series. The structurings or regions of structurings can have mutually different arrangements, number densities and covering regions with respect to the surface of the substrate.

FIG. 3B illustrates that the optoelectronic component may include two or more optically active regions 312, 322 and the structuring can be arranged or formed in an optically non-active region between a first optically active region 312 and a second optically active region 322.

By introducing the structuring even in optically non-active regions in the centre of the component, this makes it possible to improve the adhesion of the layers on or above the surface of the substrate with the substrate. The number, shape and density of the structurings can be varied for adhesion optimization and for design configuration.

FIG. 4A to FIG. 4C show schematic sectional illustrations of various embodiments of a structuring of an optoelectronic component.

FIG. 4A to FIG. 4C illustrate different topologies at structurings of the surface of a substrate, wherein only depressions of the substrate surface are shown, for example trench structures. The structurings can analogously be formed as an elevation on an otherwise planar surface of the substrate, for example as a dam structure.

The structuring 122 can have for example a stepped shape 402, wherein the side areas of the step can be straight (402), oblique 404 and/or round 406.

In addition—for the case of a barrier layer at the surface of the substrate or on a carrier, the structuring can extend through the entire layer cross section of the barrier layer 408. Alternatively, the structuring can have a random or arbitrary shape 410, for example by means of etching the material of the substrate at the surface thereof.

FIG. 4B additionally illustrates that the structurings can be formed in a manner exhibiting a plurality of steps, that is to say that the structurings can have different shapes depending on the depth in the substrate 412. A depression exhibiting a plurality of steps may have an effect in that for example the size of the side areas of the 3D structure is increased, which improves the adhesion force of the inorganic encapsulation layer on the substrate. The structuring 122 can have for example a height or depth in the substrate that is greater than approximately 1 µm.

FIG. 4C additionally illustrates that the structurings can be formed as undercuts 414, 416, which may include oblique, straight and round side areas of different depths 414, 416.

An undercut can bring about a positively locking and force-locking connection of the inorganic encapsulation layer to the substrate, for example in accordance with the key-lock principle.

Alternatively, an undercut can be configured with regard to the size of the opening of the cavity of the undercut and the depth of the undercut in such a way that the inorganic encapsulation layer cannot form on, in or above the undercut. By way of example, the opening is too large to allow an overmoulding of the opening during the formation of the inorganic encapsulation layer. As a result, the undercut can act as a barrier vis-à-vis the deposition of the inorganic encapsulation layer. The undercut can thus delimit or separate non-interconnected parts or regions of the inorganic encapsulation layer from one another. Illustratively, the undercut has an opening region that is free of inorganic encapsulation layer, that is to say that the cavity of the undercut is not closed or sealed off by the inorganic encapsulation layer.

The adhesion force is further improved depending on the embodiment of the structuring: an undercut 414, 416 can bring about a better adhesion force between the inorganic encapsulation layer and the substrate. By way of example, the organic encapsulation layer on the inorganic encapsulation layer can "interlock" in a depression of the substrate, that is to say form a force-locking and/or positively locking connection, for example for the case where the organic encapsulation layer is formed wet-chemically.

The structuring may include for example a stepped structure, a trench structure, holes or a dam structure.

FIG. 5 shows a schematic sectional illustration of an optoelectronic component in accordance with various embodiments. FIG. 5 illustrates that the surface of the substrate 102 in various embodiments in the region having the optically active layer structure 104 may include a further structuring 504. The further structuring 504 is configured to increase the roughness of the surface. The further structuring 504 can have an above-described form of a structuring of the optically inactive region.

The further structuring 504 can be configured as light-scattering, for example by virtue of the fact that the further structuring includes chamfers, steps, edges or rounded portions larger than approximately 250 nm. The light-scattering further structuring 504 in the optically active region thereby makes it possible to increase the efficiency of the optoelectronic component since the proportion of light which can be coupled out from the optoelectronic component is increased.

The inorganic encapsulation layer 106 can be formed as a closed layer in the region of the surface of the substrate 102 having the optically active layer structure 104, for example in the optically active region.

Within the optically active region, the barrier thin-film layer of the substrate, which layer is formed on the carrier and forms at least one part of the surface of the substrate, can be embodied in a non-planar fashion. However, said barrier thin-film layer is formed in a closed fashion, i.e. is free of holes (pinholes). These holes could lead to short circuits via the metal carrier. In contrast thereto, the barrier thin-film layer or the structuring in the optically inactive region may include holes, such that the surface of the carrier below the barrier thin-film layer is exposed.

The structuring in the optically inactive region brings about an improved adhesion of the layers formed above the inorganic barrier thin-film layer of the substrate. As a result, it is possible to avoid a delamination of said layers from the substrate or to reduce the likelihood of the occurrence of a delamination.

The barrier thin-film layer and/or the inorganic encapsulation layer can be embodied in a manner drawn back from the edge of the optoelectronic component (illustrated by the reference sign 502 in FIG. 5). As a result, circumferentially around the optically active region it is possible to form a topological edge parallel to the edge of the component.

In various embodiments, the encapsulation structure may include a further encapsulation layer (not illustrated), wherein the inorganic encapsulation layer is formed on or above the further encapsulation layer. The further encapsulation layer is for example formed from or substantially includes an organic material, for example an epoxy, a silicone, or some other organic material described. For the hermeticity of the encapsulation, the organic constitution of the further encapsulation layer is unproblematic if only because the further encapsulation layer does not extend into the predefined region and the organic material of the further encapsulation layer is thus not exposed laterally, but rather is encapsulated by the inorganic encapsulation layer.

The further encapsulation layer can serve for example for improving the coupling-out. By way of example, the further encapsulation layer may include particles embedded in a matrix, wherein the particles have a refractive index that is different from the material of the matrix at least by 0.05. Alternatively or additionally, the further encapsulation layer can have a refractive index that is between the refractive indices of the substrate and the optically active layer structure or between the refractive indices of the optically active layer structure and the inorganic encapsulation layer. The further encapsulation layer can have a lower roughness than the inorganic encapsulation layer. Alternatively, the further encapsulation layer may include the structuring in the optically active region. The further encapsulation layer is formed in the region of the optically active layer structure. In other words: the substrate in the predefined region is free of further organic encapsulation layer. Consequently, said further encapsulation layer does not extend right into the contact regions of the optoelectronic component.

The further encapsulation layer can be formed in the optically active region above the substrate, for example between the surface of the substrate and the optically active layer structure and/or between the optically active layer structure and the inorganic encapsulation layer.

FIG. 6 shows a flow diagram of one embodiment of a method for producing an optoelectronic component.

In various embodiments, the method 600 for producing an optoelectronic component includes forming S1 an optically active layer structure 104 on a surface of a planar substrate, wherein the surface in a predefined region remains free of optically active layer structure. The method furthermore includes forming S2 an encapsulation structure having an inorganic encapsulation layer 106, wherein the inorganic encapsulation layer 106 is formed in direct contact on the optically active layer structure 104 and in the predefined region on the surface of the substrate 102. The surface of the substrate 102 at least in the predefined region is formed with a structuring 122, wherein the structuring 122 is configured to increase the roughness of the surface.

The structuring can be formed for example by means of an etching of a metallic structure.

The method can furthermore have features of the optoelectronic component, and vice versa.

Example 1, illustrated in association with FIGS. 1 to 6, is an optoelectronic component including: an optically active layer structure on a surface of a planar substrate. The surface in a predefined region is free of optically active layer structure. The optoelectronic component may further include an encapsulation structure having an inorganic encapsulation layer. The inorganic encapsulation layer is formed on or above the optically active layer structure and the surface of the substrate in the predefined region. The inorganic encapsulation layer at least in the predefined region is formed in direct contact with the surface of the substrate. The structuring is configured to increase the roughness of the surface, and wherein the substrate at least in the predefined region at the surface thereof includes or is formed from an inorganic material.

In example 2, example 1 optionally includes the fact that the structuring is formed as one undercut or a plurality of undercuts of the substrate, wherein the undercut includes an opening region that is free of encapsulation layer.

In example 3, example 1 or 2 optionally includes the fact that the structuring is configured to circumferentially surround the optically active layer structure.

In example 4, examples 1 to 3 optionally include the fact that the surface includes a plurality of structurings offset laterally with respect to one another.

In example 5, examples 1 to 4 optionally include the fact that the structuring has a height that is greater than approximately 1 µm.

In example 6, examples 1 to 5 optionally include the fact that the substrate includes an inorganic, electrically non-conductive layer, which forms at least one part of the surface of the substrate.

In example 7, example 6 optionally includes the fact that the substrate includes a metallic structure, wherein the metallic structure is a metal sheet, a metal film or a metal-coated film.

In example 8, example 6 or 7 optionally includes the fact that the inorganic, electrically non-conductive layer is formed on the metallic structure.

In example 9, examples 1 to 8 optionally include the fact that the structuring includes or is formed from an organic material.

In example 10, examples 1 to 9 optionally include the fact that the encapsulation structure includes an organic encapsulation layer on or above the inorganic encapsulation layer, wherein the organic encapsulation layer has a roughness that is lower than the roughness of the inorganic encapsulation layer.

In example 11, examples 1 to 10 optionally include the fact that the inorganic encapsulation layer is formed such that it is hermetically impermeable vis-à-vis diffusion of water and/or oxygen.

In example 12, examples 1 to 11 optionally include the fact that the surface of the substrate in the region having the optically active layer structure includes a further structuring, wherein the further structuring is configured to increase the roughness of the surface.

In example 13, example 12 optionally includes the fact that the further structuring is configured as light-scattering.

In example 14, examples 1 to 13 optionally include the fact that the inorganic encapsulation layer is formed as a closed layer in the region of the surface of the substrate having the optically active layer structure.

Example 15, described in association with FIGS. 1 to 6, is a method for producing an optoelectronic component. The method includes forming an optically active layer structure on a surface of a planar substrate, wherein the surface in a predefined region remains free of optically active layer structure. The method furthermore includes forming an encapsulation structure having an inorganic encapsulation layer, wherein the inorganic encapsulation layer is formed on or above the optically active layer structure and the surface of the substrate in the predefined region, wherein the inorganic encapsulation layer at least in the predefined region is formed in direct contact with the surface of the substrate. The surface of the substrate at least in the predefined region is formed with a structuring, wherein the structuring is configured to increase the roughness of the surface. The substrate at least in the predefined region at the surface thereof includes or is formed from an inorganic material.

The aspects of this disclosure are not restricted to the embodiments indicated. By way of example, the optoelectronic component can be formed as a display, a solar cell or a photodetector. An optoelectronic assembly may include a plurality of the optoelectronic components described on a common carrier or housing and/or in a manner encapsulated by a common encapsulation structure.

Various embodiments provide an optoelectronic component and a method for producing same which has a lower risk of delamination. Alternatively or additionally, the intension is to improve the coupling-out of light of the optoelectronic component.

In accordance with various embodiments, an optoelectronic component includes an optically active layer structure on a surface of a planar substrate. The surface in a predefined region is free of optically active layer structure. The optoelectronic component furthermore includes an encapsulation structure having an inorganic encapsulation layer, wherein the inorganic encapsulation layer is formed on or above the optically active layer structure and the surface of the substrate in the predefined region, wherein the inorganic encapsulation layer at least in the predefined region is formed in direct contact with the surface of the substrate. The surface of the substrate at least in the predefined region includes a structuring, wherein the structuring is configured to increase the roughness of the surface. The substrate at least in the predefined region at the surface thereof includes or is formed from an inorganic material.

Illustratively, the surface of the substrate is not formed such that it is planar or plane over the whole area, but instead such that it is structured, non-planar or provided with a topology. Said topology can continue through the layers formed on the surface of the substrate, for example the inorganic encapsulation layer. However, the layers applied above the surface of the substrate can also each have a planar surface, for example by means of a planarization layer; by way of example, an organic encapsulation layer of the encapsulation structure, said organic encapsulation layer being formed from the liquid phase, can have a planarizing effect.

The optoelectronic component is for example an organic light-emitting diode. The substrate can be configured for example as mechanically flexible, for example in the form of a film or a sheet. In other words: the substrate has a low stiffness. The substrate may include or be formed from a barrier layer on a carrier. The carrier can be for example a film or a sheet. The barrier layer can be an inorganic, non-conductive layer, for example a layer that is formed by means of an atomic layer deposition (ALD) method.

In the context of this description, the structuring should be understood as a 2.5- or 3-dimensional structure or topology. The structuring can be formed for example as stepped, round, anisotropic, a statical roughness or an undercut.

The topology or structuring of the surface of the substrate leads to a better adhesion of the layers formed on the surface of the substrate. This is relevant for example in the edge region of the optoelectronic component, since delaminations often proceed from said edge region.

The increase in the roughness can bring about an increase in the effective contact area of the inorganic encapsulation layer with the surface of the substrate. In this case, the effective contact area is the actual, non-planar contact area above a planar basic area in comparison with a planar contact area having the same dimensions as the planar basic area. The adhesion of the inorganic encapsulation layer on the substrate can thereby be increased in a simple manner. This brings about a reduction of the likelihood of a delamination of layers on the surface of the substrate.

The roughness can additionally bring about a scattering of light that is guided in the substrate and/or the inorganic encapsulation layer. The coupling-out of light and thus the efficiency of the component can be increased as a result.

The structuring can additionally act as a delamination stop structure, for example by virtue of the fact that a delamination crack propagating between the inorganic encapsulation layer and the surface of the substrate is stopped at the structuring. By way of example, the structuring is formed perpendicular to the direction of propagation of the delamination crack; by way of example, the structuring is formed parallel to an edge of the component or of a cut region of the substrate.

The structuring of the surface of the substrate can be realized for example by means of an electrically non-conductive layer formed in a structured fashion on a carrier. The electrically non-conductive layer can be formed in a non-planar fashion as a structuring in the optically non-active region, i.e. can have elevations and/or depressions. In the optically inactive region of the optoelectronic component, the electrically non-conductive layer can additionally have one or more holes extending through the entire cross section of the non-conductive layer. Holes enable an increase in the structuring height and a direct contact of the inorganic encapsulation layer with the surface of the carrier that is exposed in the holes. The surface of the carrier can have a stronger adhesion than the inorganic encapsulation layer. As a result, the adhesion of the inorganic encapsulation layer on the substrate can be increased and delamination can be avoided, limited or reduced. This increases the reliability of the optoelectronic component.

By means of the lower risk of delamination in the case of the optoelectronic component in accordance with various exemplary embodiments, flexible OLEDs having potentially smaller bending radii are made possible.

In other words: the structuring can be formed such that along the path from the component edge to the optically active area there are a plurality of interruptions, for example in the form of holes or trenches.

In comparison with applying additional 3-dimensional structures by means of photoresist or printed polymers on a carrier, the adhesion in the case of a structured, inorganic substrate surface is not provided by a reduced adhesion of such organic layers on a carrier, but rather by inorganic-inorganic interfaces. The structuring makes it possible to avoid a complete delamination of the inorganic encapsulation layer from the edge region. The delamination can be induced for example during the severing of the inorganic encapsulation layer and/or of the carrier by means of laser treatment.

In one development, the inorganic encapsulation layer can be formed in direct contact on the optically active layer structure and in the predefined region on the surface of the substrate.

In a further development, the substrate at substantially the entire surface thereof, i.e. at the surface on which the optically active layer structure and the inorganic encapsulation layer are formed, may include or be formed from an inorganic material.

In accordance with one development, the structuring is formed as one undercut or a plurality of undercuts of the substrate. The undercut includes an opening region that is free of encapsulation layer.

In other words: no inorganic encapsulation layer is formed on or above the opening region of at least one undercut. In this case, the undercut can surround the optically active layer structure. In this case, the undercut can be formed in a continuous fashion, i.e. as a circumferential structure.

In the context of this description, an undercut should be understood as a cavity in the substrate that has at least one opening. In this case, the opening has a smaller width than a width of the cavity. An undercut can also be referred to as an undercut portion.

The undercut can for example act as a stop structure for delamination cracks and/or bring about formation of the inorganic encapsulation layer above the opening of the undercut, such that processes for removing the inorganic encapsulation layer are reduced.

In accordance with a further development, the structuring is configured to circumferentially surround the optically active layer structure. As a result, it is possible to increase the adhesion in every direction.

In accordance with a further development, the surface includes a plurality of structurings offset laterally with respect to one another. As a result, a delamination crack can be stopped, lengthened and/or diverted at the structurings.

In accordance with a further development, the structuring has a height that is greater than approximately 1 μm. The structuring has for example a steep sidewall, for example a step having a height difference of more than 1 μm, or brings about an interruption of the inorganic encapsulation layer, for example in the form of a hole or a trench. Furthermore, structurings having such a height can increase the contact area of the inorganic encapsulation layer with the surface of the substrate and the adhesion thereof.

The structuring can have a lateral extent that is perpendicular to the height of the structuring. The values specified below can relate to in each case one or both directions in a plane perpendicular to the height of the structuring. The specified values for the height and the lateral extent relate to an individual structure, for example a trench structure or a continuous roughened region. Alternatively, specified values for the height and the lateral extent can relate to a group of individual structures; by way of example, the structuring may include a plurality of trench structures arranged at a distance from one another and alongside one another, wherein the lateral extent is for example the distance between the outer trenches of the plurality of trenches. The structuring can additionally have a closed shape, for example in the shape of a ring or frame, for example in a closed shape or shape provided with one or more interruptions. In this case, the structuring merely has one lateral extent, i.e. the width of the "line" of the ring or frame. The specified values for the lateral extent(s) are merely illustrative examples and other values are possible in an application-specific manner. By way of example, larger lateral extents can be provided for large-area, flexible and/or mechanically loaded optoelectronic components and/or optoelectronic components which are subjected to environments exhibiting a high degree of exposure to water and/or oxygen, for example for the case where no covering is provided in the encapsulation of the optoelectronic component.

A lateral extent of the structuring can have for example a value in a range of approximately 1 µm to approximately 1 mm. By way of example, the lateral extent of the structuring is greater than approximately 1 µm; for example greater than approximately 10 µm; for example greater than approximately 50 µm; for example greater than approximately 100 µm. By way of example, the lateral extent of the structuring is however less than approximately 1 mm; for example less than approximately 500 µm; for example less than approximately 200 µm. The lateral extent can be for example the width of an elongate structuring.

A further lateral extent of the structuring can have for example a value in a range of approximately 50 µm to approximately 10 mm. By way of example, the further lateral extent of the structuring is greater than approximately 50 µm; for example greater than approximately 100 µm; for example greater than approximately 200 µm. By way of example, the further lateral extent of the structuring is however less than approximately 10 mm; for example less than approximately 5 mm; for example less than approximately 2 mm; for example less than approximately 1 mm. Alternatively, the structuring is closed upon itself, for example ring-shaped or frame-shaped, in the direction of the further lateral extent. The further lateral extent can be for example the length of an elongate structuring.

In accordance with a further development, the substrate includes an inorganic, electrically non-conductive layer, which forms at least one part of the surface of the substrate. The inorganic, electrically non-conductive layer can also be referred to as a barrier layer. The inorganic, electrically non-conductive layer brings about an electrically insulating surface and/or an encapsulation of the carrier. The structuring can be formed in the inorganic, electrically non-conductive layer.

In accordance with a further development, the substrate includes a metallic structure. The metallic structure is for example a metal sheet, a metal film or a metal-coated film. In accordance with a further development, the inorganic, electrically non-conductive layer is formed on the metallic structure. The metallic structure can be used for electrically contacting the optically active layer structure. Furthermore, the metallic structure can act as a mirror structure and/or a heat dissipating structure or heat spreading structure for the optically active layer structure and the light that can be emitted thereby. The inorganic, electrically non-conductive layer can bring about electrical insulation of the metallic structure, thereby preventing short circuits with the metallic structure.

In accordance with a further development, the structuring includes or is formed from an organic material.

In accordance with a further development, the encapsulation structure includes an organic encapsulation layer on or above the inorganic encapsulation layer. The organic encapsulation layer has a roughness that is lower than the roughness of the inorganic encapsulation layer. In other words: the organic encapsulation layer can bring about a planarization of the surface. In addition, the organic encapsulation layer—for the case where the inorganic encapsulation layer is thin in comparison with the structuring—together with the structuring can form a force-locking and/or positively locking connection, for example a key-lock connection.

In accordance with a further development, the inorganic encapsulation layer is formed such that it is hermetically impermeable vis-à-vis diffusion of water and/or oxygen. This brings about an encapsulation of the optically active layer structure.

In the context of this description, a layer that is hermetically impermeable vis-à-vis water and/or oxygen can be understood as a substantially hermetically impermeable layer. A hermetically impermeable layer can have for example a diffusion rate vis-à-vis water and/or oxygen of less than approximately $10^{-1}$ g/(m$^2$d); a hermetically impermeable covering and/or a hermetically impermeable carrier can have for example a diffusion rate vis-à-vis water and/or oxygen of less than approximately $10^{-4}$ g/(m$^2$d), for example in a range of approximately $10^{-4}$ g/(m$^2$d) to approximately $10^{-10}$ g/(m$^2$d), for example in a range of approximately $10^{-4}$ g/(m$^2$d) to approximately $10^{-6}$ g/(m$^2$d). In various configurations, a substance that is hermetically impermeable vis-à-vis water or a hermetically impermeable substance mixture may include or be formed from a ceramic, a metal and/or a metal oxide.

In accordance with a further development, the surface of the substrate in the region having the optically active layer structure includes a further structuring. The further structuring is configured to increase the roughness of the surface. Within the optically active area, the structuring leads to internal coupling-out of light and thus to increased efficiency. The further structure is configured for example in a manner free of holes. By means of the structured, inorganic material at the surface of the substrate it is possible to reduce the complexity in component fabrication since—with the use of a metal carrier—an inorganic barrier or insulation layer that is used anyway for the insulation of the metal carrier can also be used for an improved coupling-out of light.

In accordance with a further development, the further structuring is configured as light-scattering. This makes it possible to increase the coupling-out of light and thus the efficiency of the optoelectronic component.

In accordance with a further development, the inorganic encapsulation layer is formed as a closed layer in the region of the surface of the substrate having the optically active layer structure. This makes it possible to avoid short circuits if an electrically conductive metal carrier is used.

In accordance with a further aspect of the invention, the object is achieved by means of a method for producing an optoelectronic component. The method includes forming an optically active layer structure on a surface of a planar substrate. The surface in a predefined region remains free of optically active layer structure. The method furthermore includes forming an encapsulation structure having an inorganic encapsulation layer, wherein the inorganic encapsulation layer is formed on or above the optically active layer structure and the surface of the substrate in the predefined region, wherein the inorganic encapsulation layer at least in the predefined region is formed in direct contact with the surface of the substrate. The surface of the substrate at least in the predefined region is formed with a structuring. The structuring is configured to increase the roughness of the surface. The substrate at least in the predefined region at the surface thereof includes or is formed from an inorganic material.

In the case of substrates including a metal carrier, for example in the form of an aluminium film, the surface of the carrier can be provided with an oxide layer and form the surface of the substrate. The carrier can be provided with a structuring. The side areas of the structures of the structuring can be covered for example during anodization with the oxide layer. By way of example, corrosion of the aluminium carrier can be avoided as a result.

The structuring can be formed by means of a dry etching method, for example plasma etching, deep reactive ion etching, plasma-assisted etching or ion thinning. Alternatively or additionally, the structuring can be formed by means of a wet-chemical method, for example crystal-orientation-dependent, anisotropic etching. Metal etching is a process which proceeds in a cold state and in which the original properties of the material are maintained. In this case, the parts are not subjected to considerable mechanical forces and loads, for which reason etching does not cause stresses or deformations. Moreover, in contrast to parts produced using lasers, the component parts remain burr-free and maintain their original hardness and magnetic properties. Etching tiny shapes of high complexity is possible with tolerances in the 1/100 mm range. Adhesion-enhancing structures can thus be inserted in particular into metal film. Most metals can be etched, including stainless steel and "corrosion-resistant" modern engineering alloys such as titanium and Nitinol. Even hard or brittle metals can be etched successfully with the aid of the same process chemistry. Consequently, metal etching is ideal for processing thin metal sheets and films.

Alternatively, the structuring can be formed by means of an embossing method or a nanoimprint method.

LIST OF REFERENCE SIGNS

100 Optoelectronic component
102 Substrate
104 Optically active layer structure
106 Inorganic encapsulation layer
108 Organic encapsulation layer
110 Enlarged portion
112 Barrier layer
114, 118 Electrode
116 Organic functional layer structure
120 Insulation structure
122 Structuring
124 Carrier
14 Electrode layer
16, 18 Contact section
32, 34 Contact region
38 Covering body
302, 312, 322 Optically active region
306 Optically inactive region
402, 404, 406, 408, 410, 412, 414, 416 Example of a structuring
502 Spacing region
504 Structuring in the optically active region
600 Method
S1, S2 Processes
TE Direction of top emission
BE Direction of bottom emission While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. An optoelectronic component, comprising:
an optically active layer structure on a surface of a planar substrate, wherein the surface in a predefined region is free of optically active layer structure; and
an encapsulation structure having an inorganic encapsulation layer, wherein the inorganic encapsulation layer is formed on or above the optically active layer structure and the surface of the substrate in the predefined region, wherein the inorganic encapsulation layer at least in the predefined region is formed in direct contact with the surface of the substrate;
wherein the surface of the substrate at least in the predefined region comprises a structuring, wherein the structuring is configured to increase roughness of the surface; and
wherein the substrate at least in the predefined region at the surface thereof comprises or is formed from an inorganic material.
2. The optoelectronic component of claim 1,
wherein the structuring is formed as one undercut or a plurality of undercuts of the substrate, wherein the undercut comprises an opening region that is free of encapsulation layer.
3. The optoelectronic component of claim 1,
wherein the structuring is configured to circumferentially surround the optically active layer structure.
4. The optoelectronic component of claim 1,
wherein the surface comprises a plurality of structurings offset laterally with respect to one another.
5. The optoelectronic component of claim 1,
wherein the structuring has a height that is greater than approximately 1 μm.
6. The optoelectronic component of claim 1,
wherein the substrate comprises an inorganic, electrically non-conductive layer, which forms at least one part of the surface of the substrate.
7. The optoelectronic component of claim 1,
wherein the structuring comprises or is formed from an organic material.
8. The optoelectronic component of claim 1,
wherein the encapsulation structure comprises an organic encapsulation layer on or above the inorganic encapsulation layer, wherein the organic encapsulation layer has a roughness that is lower than the roughness of the inorganic encapsulation layer.
9. The optoelectronic component of claim 1,
wherein the inorganic encapsulation layer is formed such that it is hermetically impermeable vis-à-vis diffusion of at least one of water or oxygen.
10. The optoelectronic component of claim 1,
wherein the surface of the substrate in the region having the optically active layer structure comprises a further structuring, wherein the further structuring is configured to increase the roughness of the surface.
11. The optoelectronic component of claim 1,
wherein the further structuring is configured as light-scattering.
12. The optoelectronic component of claim 1,
wherein the inorganic encapsulation layer is formed as a closed layer in the region of the surface of the substrate having the optically active layer structure.
13. The optoelectronic component of claim 6,
wherein the substrate comprises a metallic structure, wherein the metallic structure is a metal sheet, a metal film or a metal-coated film.

14. The optoelectronic component of claim 6,
wherein the inorganic, electrically non-conductive layer is formed on the metallic structure.

15. A method for producing an optoelectronic component, the method comprising:
forming an optically active layer structure on a surface of a planar substrate,
wherein the surface in a predefined region remains free of optically active layer structure; and
forming an encapsulation structure having an inorganic encapsulation layer,
wherein the inorganic encapsulation layer is formed on or above the optically active layer structure and the surface of the substrate in the predefined region,
wherein the inorganic encapsulation layer at least in the predefined region is formed in direct contact with the surface of the substrate;
wherein the surface of the substrate at least in the predefined region is formed with a structuring, wherein the structuring is configured to increase the roughness of the surface; and
wherein the substrate at least in the predefined region at the surface thereof comprises or is formed from an inorganic material.

* * * * *